United States Patent
Park et al.

(10) Patent No.: US 8,373,237 B2
(45) Date of Patent: Feb. 12, 2013

(54) TRANSISTOR AND METHOD OF MANUFACTURING THE SAME

(75) Inventors: Sung-ho Park, Yongin-si (KR);
Chang-jung Kim, Yongin-si (KR);
I-hun Song, Seongnam-si (KR);
Sang-wook Kim, Yongin-si (KR);
Jae-chul Park, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 465 days.

(21) Appl. No.: 12/458,251

(22) Filed: Jul. 7, 2009

(65) Prior Publication Data
US 2010/0140608 A1 Jun. 10, 2010

(30) Foreign Application Priority Data
Dec. 4, 2008 (KR) .................. 10-2008-0122388

(51) Int. Cl.
*H01L 27/088* (2006.01)
(52) U.S. Cl. .......... 257/401; 257/67; 257/327; 257/365; 257/E21.619; 257/E21.634; 257/E21.614; 257/E21.615; 257/E21.616
(58) Field of Classification Search .................. 257/43, 257/401, 67, E21.614–E21.616, 365, E29.137, 257/327, 902, E21.619, E21.634
See application file for complete search history.

(56) References Cited

U.S. PATENT DOCUMENTS

| 6,855,989 B1* | 2/2005 | Wang et al. ................... 257/349 |
| 2005/0199879 A1 | 9/2005 | Hoffman et al. |
| 2007/0004224 A1* | 1/2007 | Currie ........................... 438/778 |
| 2007/0072335 A1* | 3/2007 | Baik et al. ...................... 438/99 |
| 2008/0017934 A1* | 1/2008 | Kim et al. .................... 257/401 |
| 2008/0128760 A1* | 6/2008 | Jun et al. ....................... 257/280 |
| 2008/0191247 A1* | 8/2008 | Yin et al. ...................... 257/204 |

FOREIGN PATENT DOCUMENTS

| JP | 2005-051241 | 2/2005 |
| JP | 2007-220817 | 8/2007 |
| JP | 2007-220818 | 8/2007 |
| JP | 2007-305658 | 11/2007 |
| JP | 2008-060419 | 3/2008 |
| KR | 10-2007-0102969 | 10/2007 |
| KR | 10-2007-0102969 A | 10/2007 |

* cited by examiner

*Primary Examiner* — Kenneth Parker
*Assistant Examiner* — Jose R Diaz
(74) *Attorney, Agent, or Firm* — Harness, Dickey & Pierce, P.L.C.

(57) ABSTRACT

Example embodiments provide a transistor and a method of manufacturing the same. The transistor may include a channel layer formed of an oxide semiconductor and a gate having a three-dimensional structure. A plurality of the transistors may be stacked in a perpendicular direction to a substrate. At least some of the plurality of transistors may be connected to each other.

18 Claims, 14 Drawing Sheets

TRANSISTOR AND METHOD OF MANUFACTURING THE SAME

CROSS-REFERENCE TO RELATED APPLICATION

This application claims priority under 35 U.S.C. §119 to Korean Patent Application No. 10-2008-0122388, filed on Dec. 4, 2008, in the Korean Intellectual Property Office (KIPO), the entire contents of which are incorporated herein by reference.

BACKGROUND

1. Field

One or more example embodiments relate to a transistor and a method of manufacturing the same.

2. Description of the Related Art

Transistors are commonly used as switching devices or driving devices in electrical devices. Logic circuits often include transistors.

Transistors in some commercialized semiconductor devices have been silicon (Si)-based. Some of these transistors realize a higher mobility by using a portion of a monocrystalline Si substrate as a channel. However, such a transistor can only be manufactured on the monocrystalline Si substrate. A thin film transistor, having a channel layer formed of amorphous Si (hereinafter referred to as an amorphous Si thin film transistor), has a lower charge mobility, which may be about 0.5 $cm^2/Vs$, and thus operates at a lower speed. A thin film transistor, using a polycrystalline Si layer as a channel layer, has a higher mobility than the amorphous Si thin film transistor. However, such a thin film transistor is manufactured through a higher temperature crystallization process and thus has a more difficult manufacturing process and a higher manufacturing cost. In addition, an ion injection process and a higher-temperature annealing process are required to form a source and a drain of a typical Si-based transistor. Also, these processes may cause various problems in device characteristics, restrict applicable materials, and increase a manufacturing cost.

Further, transistors that have been minimized as semiconductor devices are highly integrated. However, as the size of these transistors is reduced, an ON-current that flows through a channel is also reduced and thus a current required to operate a semiconductor device cannot be easily supplied.

SUMMARY

One or more example embodiments include an oxide transistor.

One or more example embodiments include a method of manufacturing the oxide transistor.

A transistor may include one or more first transistors on a substrate, wherein each of the one or more first transistors includes a channel layer which is formed of an oxide semiconductor, a source and a drain which separately contact two ends of the channel layer in a length direction of the channel layer, and a gate which covers top and side surfaces of the channel layer in a width direction of the channel layer.

The oxide semiconductor may include a zinc oxide (ZnO)-based material or an indium oxide ($In_2O_3$)-based material.

The source and the drain may include a metal oxide or a metal.

The surfaces of the channel layer which contact the source and the drain may be treated with plasma.

The source and the drain may be oxide semiconductor layers which are treated with plasma.

The transistor may further include one or more second transistors which are vertically stacked on the one or more first transistors.

The one or more second transistors may have the same structure as the one or more first transistors.

The transistor may further include a first common electrode which is commonly connected to sources of the one or more first transistors and the one or more second transistors, a second common electrode which is commonly connected to drains of the one or more first transistors and the one or more second transistors, and a third common electrode which is commonly connected to gates of the one or more first transistors and the one or more second transistors.

The one or more first transistors and the one or more second transistors may be divided into first group transistors and second group transistors, wherein sources, drains, and gates of the first group transistors are commonly connected to first, second, and third common electrodes, respectively, and wherein sources, drains, and gates of the second group transistors are commonly connected to fourth, fifth, and sixth electrodes, respectively.

A method of manufacturing a transistor including one or more first transistors on a substrate, wherein forming the one or more first transistors may include forming an oxide semiconductor pattern on the substrate, forming source/drain material layers on both sides of the oxide semiconductor pattern, forming one or more structures each having a source, a drain, and a channel layer between the source and the drain by patterning the oxide semiconductor pattern and the source/drain material layers, and forming a gate which covers top and side surfaces of the channel layer.

The oxide semiconductor pattern may include a zinc oxide (ZnO)-based material or an indium oxide ($In_2O_3$)-based material.

The method may further include treating both side surfaces of the oxide semiconductor pattern with plasma before forming the source/drain material layers.

The method may further include forming a first interlayer insulating layer which covers the one or more first transistors and forming one or more second transistors on the first interlayer insulating layer, the one or more second transistors being vertically stacked on the one or more first transistors.

The one or more second transistors may be formed in the same manner as the one or more first transistors.

The method may further include forming a first common electrode which is commonly connected to sources of the one or more first transistors and the one or more second transistors, forming a second common electrode which is commonly connected to drains of the one or more first transistors and the one or more second transistors, and forming a third common electrode which is commonly connected to gates of the one or more first transistors and the one or more second transistors.

The one or more first transistors and the one or more second transistors may be divided into first group transistors and second group transistors.

The method may further include forming first, second, and third common electrodes which are commonly connected to sources, drains, and gates of the first group transistors, respectively and forming fourth, fifth, and sixth electrodes which are commonly connected to sources, drains, and gates of the second group transistors, respectively.

A method of forming a transistor which may include forming one or more first transistors on a substrate, wherein forming the one or more first transistors includes forming one or more oxide semiconductor patterns on the substrate, forming a gate which covers top and side surfaces of center portions of the one or more oxide semiconductor patterns, and forming a source and a drain in two side portions of the one or more oxide semiconductor patterns which are not covered by the gate.

The one or more oxide semiconductor patterns may include a zinc oxide (ZnO)-based material or an indium oxide ($In_2O_3$)-based material.

The sources and the drains may be formed by treating the two side portions of the one or more oxide semiconductor patterns which are not covered by the gate with plasma.

The method may further include forming a first interlayer insulating layer which covers the one or more first transistors and forming one or more second transistors on the first interlayer insulating layer, the one or more second transistors being vertically stacked on the one or more first transistors.

The one or more second transistors may be formed in the same manner as the one or more first transistors.

The method may further include forming a first common electrode which is commonly connected to sources of the one or more first transistors and the one or more second transistors, forming a second common electrode which is commonly connected to drains of the one or more first transistors and the one or more second transistors, and forming a third common electrode which is commonly connected to gates of the one or more first transistors and the one or more second transistors. The one or more first transistors and the one or more second transistors may be divided into first group transistors and second group transistors and the method may further include forming first, second, and third common electrodes which are commonly connected to sources, drains, and gates of the first group transistors, respectively and forming fourth, fifth, and sixth electrodes which are commonly connected to sources, drains, and gates of the second group transistors, respectively.

BRIEF DESCRIPTION OF THE DRAWINGS

The above and other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
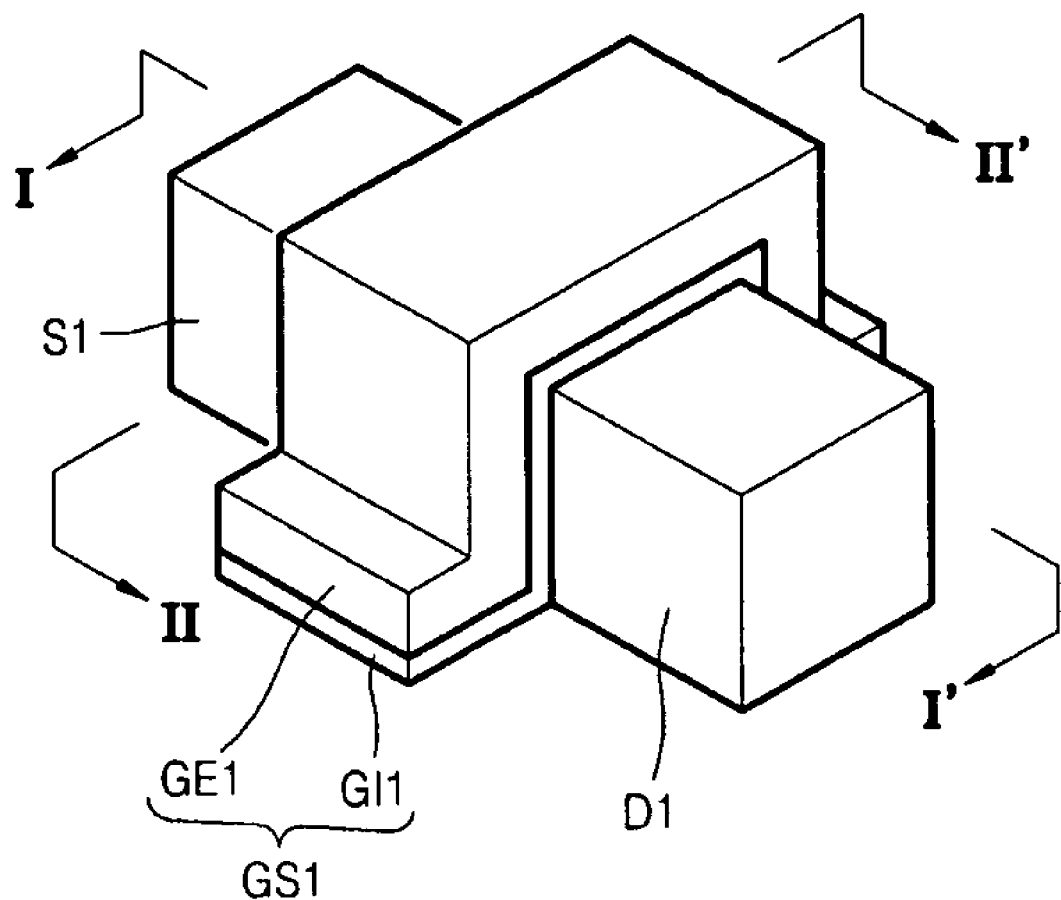
FIG. 1 is a perspective view of a transistor according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
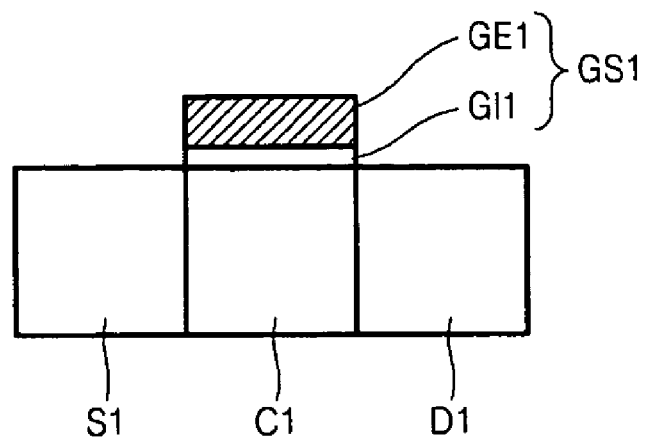
FIGS. 2 and 3 are cross-sectional views taken along lines I-I' and II-II' of FIG. 1, respectively.
Figure 3:
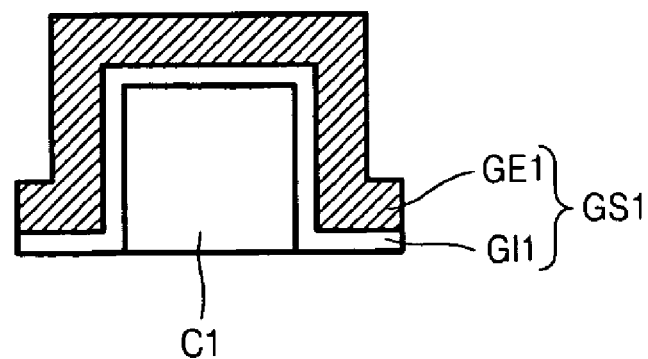

FIG. 1 is a perspective view of a transistor according to example embodiments. FIGS. 2 and 3 are cross-sectional views taken along lines I-I' and II-II' of FIG. 1, respectively.

Referring to FIGS. 1 and 2, a channel layer C1 may be formed between a source S1 and a drain D1. The channel layer C1 may be an oxide semiconductor layer. For example, the channel layer C1 may be a semiconductor layer containing a zinc oxide (ZnO)-based material. The channel layer C1 may further contain a group III element, a group IV element, or an element from another group. The group III element may be, for example, indium (In) or In and gallium (Ga), and the group IV element may be, for example, tin (Sn). According to additional example embodiments, the channel layer C1 may be a semiconductor layer containing an indium oxide ($In_2O_3$)-based material. In this example embodiment, the channel layer C1 may contain the group IV element such as Sn. If the channel layer C1 is formed of an oxide semiconductor, the channel layer C1 may be formed in a lower-temperature process instead of a higher-temperature process for crystallization and a plurality of the channel layers may be more easily stacked on one another with an interlayer insulating layer interposed therebetween. Also, since an oxide semiconductor layer has a greater mobility than an amorphous silicon (Si) or polycrystalline Si layer, a transistor formed by using the oxide semiconductor layer may operate at a higher speed.

The source S1 and the drain D1 may be formed to contact two ends of the channel layer C1, for example, the source S1 and drain D1 may contact two sides of the channel layer C1 in a length direction of the channel layer C1. The source S1 and the drain D1 may contain a metal oxide or a metal. The metal oxide may be, for example, an indium tin oxide (ITO), an aluminum zinc oxide (AZO), or an indium zinc oxide (IZO). The metal may be a higher work function material such as nickel (Ni), palladium (Pd), platinum (Pt), iridium (Ir) or rhodium (Rh) or a lower work function material such as tantalum (Ta), titanium (Ti), or erbium (Er). Additionally, the metal may be a material whose work function is between a higher work function of the higher work function material and a lower work function of the lower work function material, for example, cobalt (Co), tungsten (W) or molybdenum (Mo). When the source S1 and the drain D1 contain the metal oxide or the metal, portions of the channel layer C1 which contact the source S1 and the drain D1 may be treated with plasma such as argon (Ar)-plasma. As such, if the portions of the channel layer C1 which contact the source S1 and the drain D1 are treated with the plasma, a Schottky barrier may be formed between the channel layer C1 and the source S1 and the drain D1, and contact characteristics may be improved. In additional example embodiments, the source S1 and the drain D1 may be a conductive layer based on a semiconductor material instead of the metal oxide or the metal. A base material of the source S1 and the drain D1 may be the same as the oxide semiconductor used to form the channel layer C1, and portions of the source S1 and the drain D1 may be treated with plasma. For example, the source S1 and the drain D1 may be formed by forming an oxide semiconductor layer pattern that extends in a given direction, and treating two ends of the oxide semiconductor layer pattern with plasma. The oxide semiconductor layer pattern between the source S1 and the drain D1 may be defined as the channel layer C1. The plasma may be single gas plasma (e.g., Ar plasma, xenon (Xe) plasma, hydrogen (H) plasma, hydrogen (H)-containing gas plasma, etc.) or mixed gas plasma (e.g., sulfur hexafluoride ($SF_6$)/oxygen ($O_2$) mixed gas plasma, etc.).

According to example embodiments, the source S1 and the drain D1 may be formed without performing an ion injection process and a higher-temperature annealing process for activation. Thus, a lower-temperature process may be performed, and a lower cost may be incurred. Also, the lower-temperature process facilitates the manufacture of a transistor having improved operation characteristics without deterioration caused by a higher-temperature process and without material restrictions.

Referring to FIGS. 1 and 3, example embodiments provide that a gate GS1 may be formed to cover top and side surfaces of the channel layer C1. The gate GS1 may include a gate insulating layer GI1 and a gate electrode GE1, and which may be stacked on the channel layer C1. Performing a higher-temperature process may restrict the materials that can be used to form the gate insulating layer GI1 and the gate electrode GE1. However, according to example embodiments, the transistor may be formed in a lower-temperature process, and thus a larger number of materials may be used to form the gate insulating layer GI1 and the gate electrode GE1. The gate insulating layer GI1 may contain a Si oxide, a Si nitride, or a variety of higher-K dielectric materials. The higher-K dielectric materials may include a hafnium (Hf) oxide, an aluminum (Al) oxide, a lanthanum (La) oxide, a zirconium (Zr) oxide, a HfSi oxide, a HfSi nitric oxide, a HfLa oxide, a LaAl oxide, and a SiTi oxide. The gate electrode GE1 may contain a higher work function material, for example, a metal such as Ni, Pd, Pt, Ir, or Rh, a metal nitride such as TiAlN, MoN, or TaCN, a metal oxide such as ITO or IZO, or a mixture thereof. Additionally, the gate electrode GE1 may contain a lower work function material, for example, a metal such as Ta, Ti, or Er, a metal nitride such as $W_2N$, TaSiN, or (RE)TaN, a metal oxide such as $ITO_x$ or $IZO_x$, or a mixture thereof. Further example embodiments provide that the gate electrode GE1 may contain a metal such as a material whose work function is between a higher work function of the higher work function material and a lower work function of the lower work function material, for example, Co, W, or Mo and/or any nitride or any oxide having a controllable work function. As such, since various materials may be used, the transistor may have improved characteristics. Also, according to example embodiments, because three surfaces of the channel layer C1 are covered by the gate GS1, the channel layer C1 may have an effective channel width that is three times wider than that of a channel layer having one surface covered. Thus, the transistor according to the current embodiment may generate an ON-current that is about three times higher than that of a typical planar type transistor.

A conventional Si-based transistor may not be easily stacked on another transistor. However, the transistor according to example embodiments illustrated in FIG. 1 may be more easily stacked on another transistor. If two or more transistors as illustrated in FIG. 1 are stacked on one another, are connected to each other, and are used as a single transistor, a plurality of stacked channel layers may be simultaneously used and thus a higher ON-current may be obtained.

Figure 4:
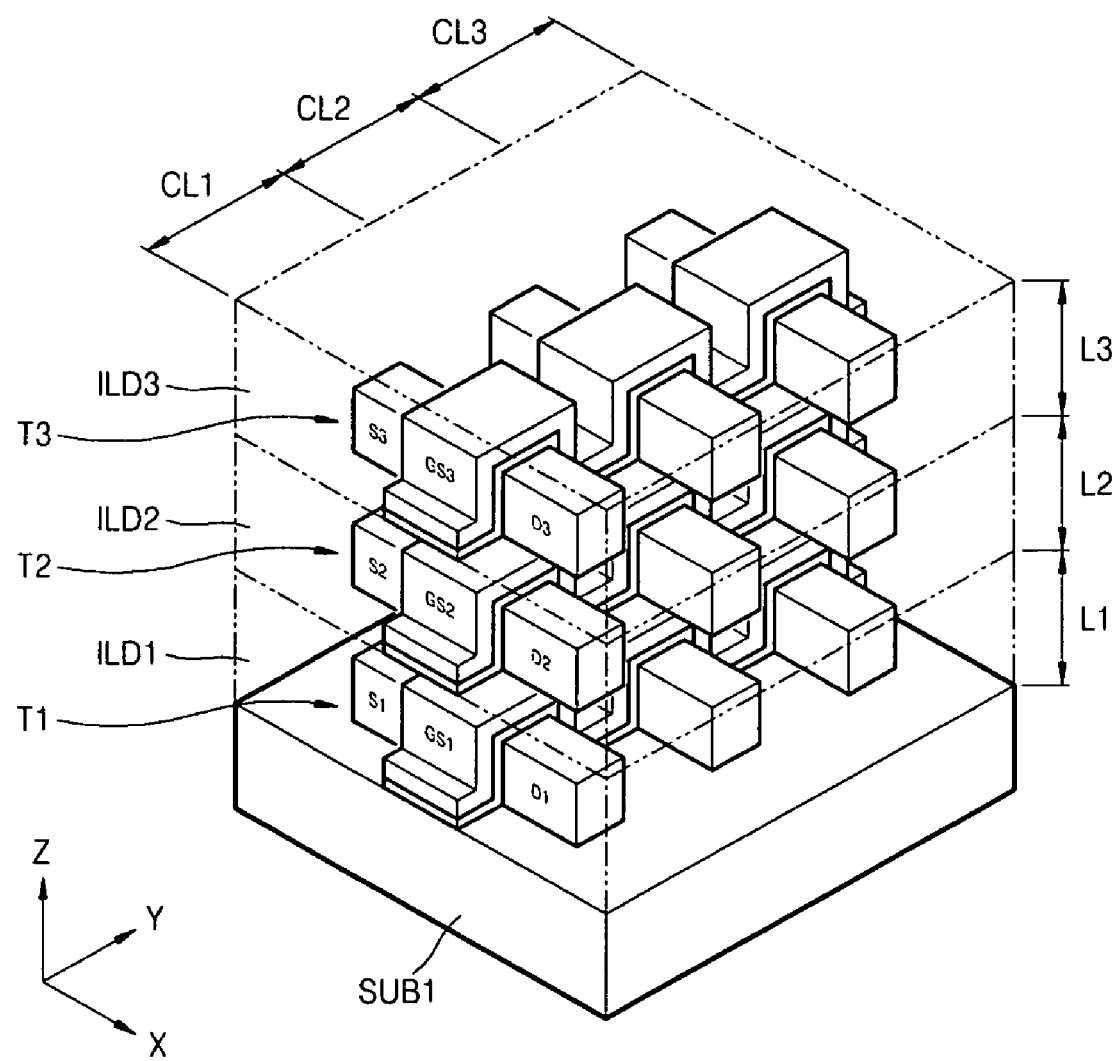
FIG. 4 is a perspective view of a stacked transistor according to example embodiments.

FIG. 4 is a perspective view of a stacked transistor according to example embodiments. The X, Y and Z directions are provided in FIG. 4 for illustrative purposes only and should not be construed as limiting any example embodiment.

Referring to FIG. 4, the stacked transistor according to example embodiments may have a multi-layer stacked structure, for example, a 3-layer stacked structure. In FIG. 4, reference numerals L1 through L3 represent first through third areas, respectively, that are divided according to layers. One or more transistors may be included in each of the first through third areas L1 through L3. Reference numerals T1 through T3 represent first through third transistors included in the first through third areas L1 through L3, respectively. Each of the first through third transistors T1 through T3 may have the same structure as the transistor illustrated in FIG. 1. Reference numerals S1 through S3, D1 through D3, and GS1 through GS3 represent first through third sources, first through third drains, and first through third gates, respectively, which are included in the first through third transistors T1 through T3, respectively.

One or more first transistors T1 and a first interlayer insulating layer ILD1 that covers the first transistors T1 may be formed on a substrate SUB1. The first transistors T1 may extend parallel to an X direction and may be apart from each other at a given interval in a Y direction. One or more second transistors T2 and a second interlayer insulating layer ILD2 that covers the second transistors T2 may be formed on the first interlayer insulating layer ILD1. One or more third transistors T3 and a third interlayer insulating layer ILD3 that covers the third transistors T3 may be formed on the second interlayer insulating layer ILD2. The second transistors T2 may be formed above the first transistors T1 in one-to-one correspondence and, likewise, the third transistors T3 may be formed above the second transistors T2 in one-to-one correspondence. In such example embodiments, the first through third transistors T1 through T3 of a front column may be referred to as transistors included in a first column CL1 and, likewise, the first through third transistors T1 through T3 of a middle column and of a rear column may be referred to as transistors included in a second column CL2 and transistors included in a third column CL3, respectively. However, additional example embodiments provide that a second transistor T2 may be formed between two first transistors T1 on the first interlayer insulating layer ILD1 and that a third transistor T3 may be formed between two second transistors T2 on the second interlayer insulating layer ILD2.

The first gate GS1 may extend in the Y direction to cover channel layers of the first transistors T1 and, likewise, the second and third gates GS2 and GS3 may also extend in the Y direction. Example embodiments further provide that at least one of the first through third gates GS1 through GS3 may have a discontinuous shape, for example, a separated shape. Additionally, the first gates GS1 of the first transistors T1 included in the first and second columns CL1 and CL2 may be separately formed from the first gate GS1 of the first transistor T1 included in the third column CL3.

Figure 5:
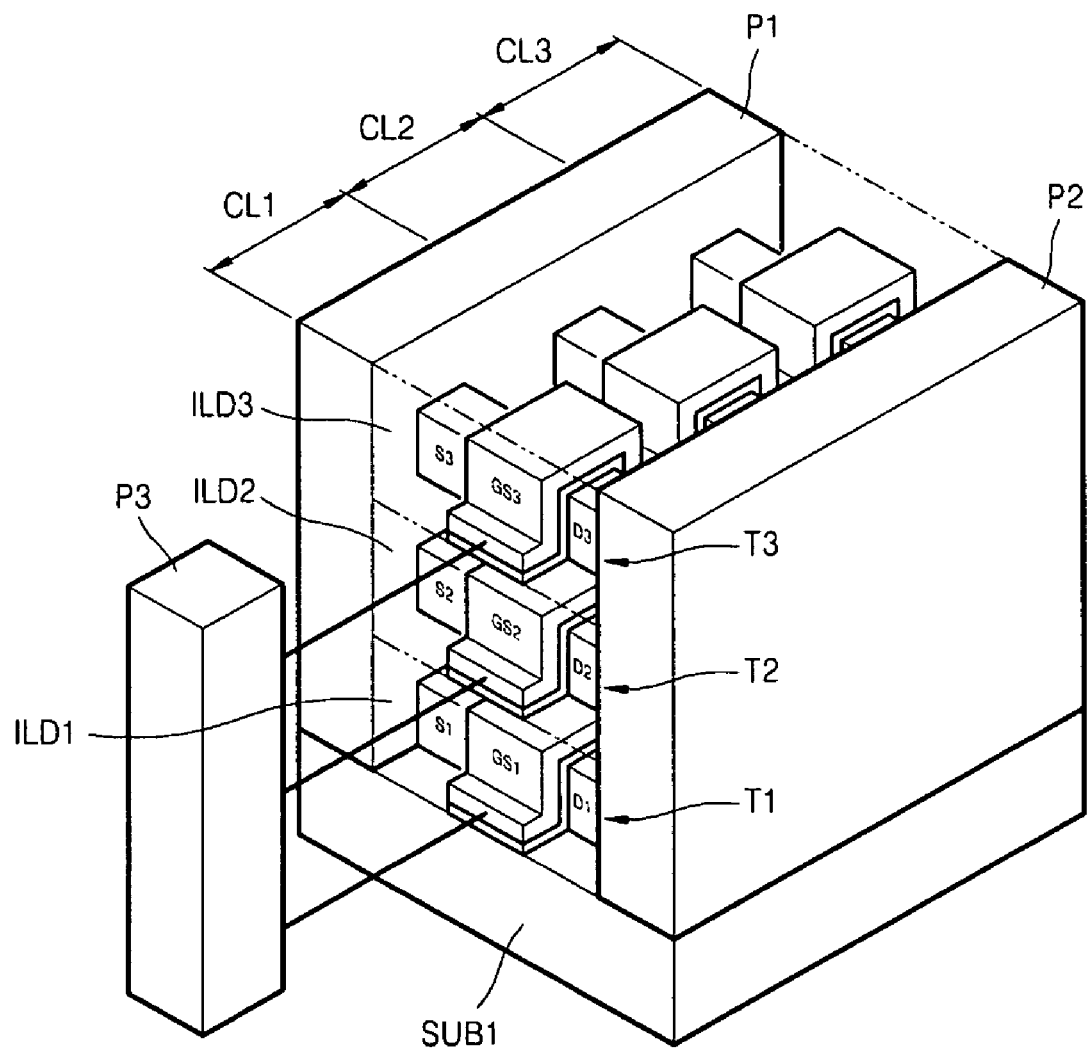
FIGS. 5 and 6 are perspective views showing connections between the stacked transistor illustrated in FIG. 4 and electrodes according to example embodiments.

FIG. 5 is a perspective view showing connections between the stacked transistor illustrated in FIG. 4 and electrodes, according to example embodiments. FIG. 5 will be described in conjunction with FIG. 4. The X, Y and Z directions are provided on FIG. 5 for illustrative purposes only and should not be construed as limiting any example embodiment.

Referring to FIG. 5, a first conductive plug P1 may be may be formed to contact all of the first through third sources S1 through S3 and a second conductive plug P2 may be formed to contact all of the first through third drains D1 through D3. Thus, all of the first through third transistors T1 through T3 may be connected to the first and second conductive plugs P1 and P2 in parallel. Also, a third conductive plug P3 may be formed to be commonly connected to the first through third gates GS1 through GS3. Although not shown in FIG. 5, first and second electrodes may be formed on the third interlayer insulating layer ILD3 so as to contact the first and second conductive plugs P1 and P2, respectively. A third electrode may also be formed on the third interlayer insulating layer ILD3 so as to contact the third conductive plug P3.

A stacked transistor according to example embodiments where all of the first through third transistors T1 through T3 are connected to the first and second conductive plugs P1 and P2 in parallel, may operate as a single transistor. Channel layers of all of the first through third transistors T1 through T3 may be simultaneously used and thus a higher ON-current may be obtained. Meanwhile, since the first through third transistors T1 through T3 are connected to the first and second conductive plugs P1 and P2 in parallel, an overall resistance of the stacked transistor may be lower. As such, a stacked transistor having a lower overall resistance and a higher ON-current may be implemented.

Figure 6:
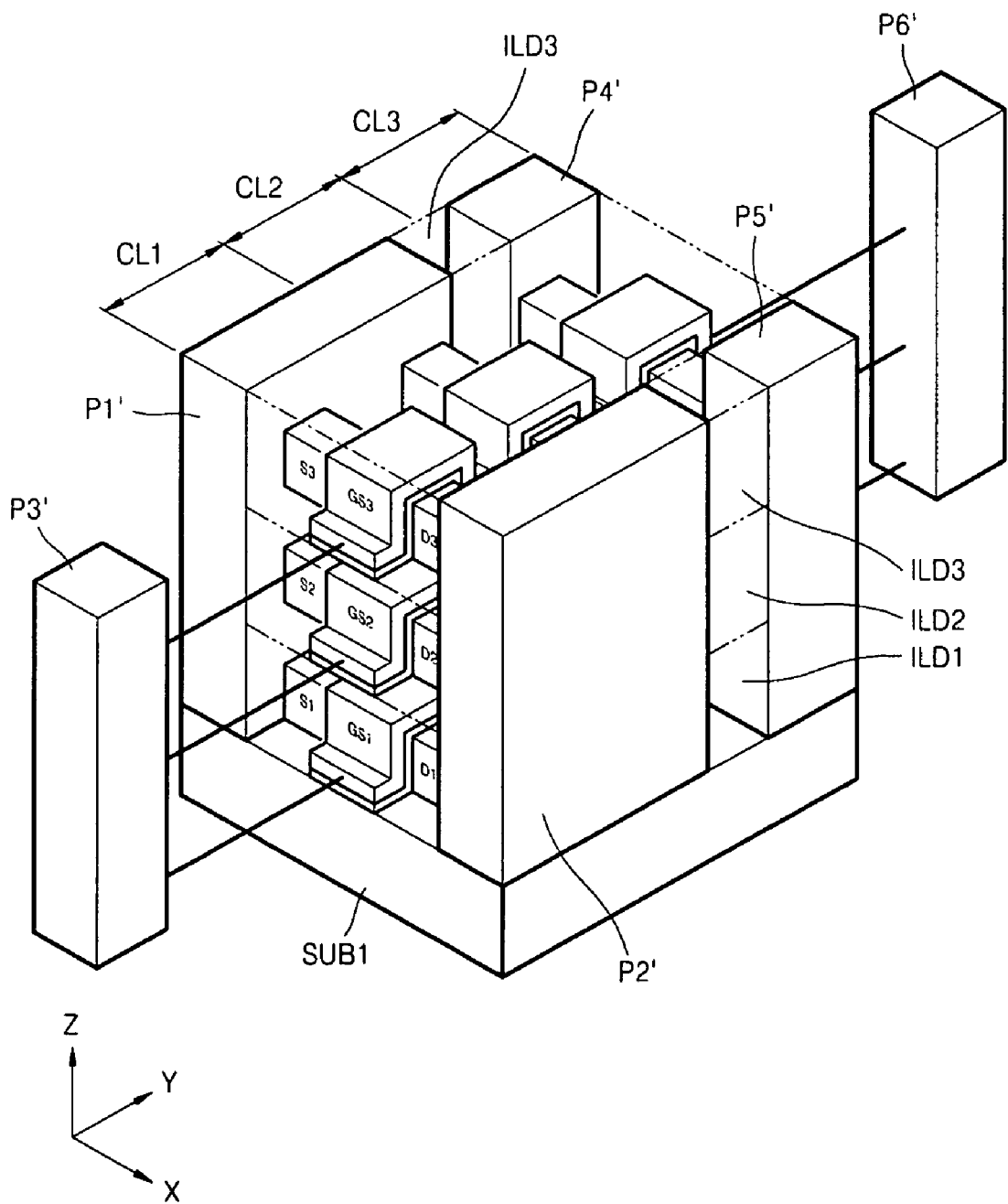

FIG. 6 is a perspective view showing connections between the stacked transistor illustrated in FIG. 4 and electrodes, according to example embodiments. FIG. 6 will be described in conjunction with FIG. 4. The X, Y and Z directions are provided on FIG. 6 for illustrative purposes only and should not be construed as limiting any example embodiment.

Referring to FIG. 6, the first through third transistors T1 through T3 included in the first and second columns CL1 and CL2 may be connected in parallel to first and second conductive plugs P1' and P2'. The first through third transistors T1 through T3 included in the third column CL3 may be connected in parallel to fourth and fifth conductive plugs P4' and P5'. The first through third gates GS1 through GS3 of the first through third transistors T1 through T3 included in the first and second columns CL1 and CL2 may be commonly connected to a third conductive plug P3'. The first through third gates GS1 through GS3 of the first through third transistors T1 through T3 included in the third column CL3 may be commonly connected to a sixth conductive plug P6'. The first through third interlayer insulating layers ILD1 through ILD3 may be formed between the first and fourth conductive plugs P1' and P4' and between the second and fifth conductive plugs P2' and P5'.

Example embodiments further provide that the first through third transistors T1 through T3 included in the first through third columns CL1 through CL3 may be divided into two groups. The first through third transistors T1 through T3 included in one of the groups (hereinafter referred to as the first group) may be connected to the first and second conductive plugs P1' and P2' in parallel. The first through third transistors T1 through T3 included in the other group (hereinafter referred to as the second group) may be connected to the fourth and fifth conductive plugs P4' and P5' in parallel. The first through third gates GS1 through GS3 of the first through third transistors T1 through T3 included in the first group may be separated from the first through third gates GS1 through GS3 of the first through third transistors T1 through T3 included in the second group. Further example embodiments provide that the first through third transistors T1 through T3 included in the first and second columns CL1 and CL2 may operate as one transistor and the first through third transistors T1 through T3 included in the third column CL3 may operate as another transistor.

A transistor according to example embodiments may be used to implement inverters and various logic devices such as a NAND device, a NOR device, an encoder, a decoder, a multiplexer (MUX), a demultiplexer (DEMUX), and a sense amplifier. Basic structures of the inverters and the logic devices are well known in the art and thus detailed descriptions thereof are omitted. Such inverters and logic devices may be applied to various devices such as a liquid crystal display (LCD) device, an organic light emitting diode (OLED), and a memory device. In additional example embodiments, the transistor is an oxide transistor that can be formed in a lower-temperature process and has improved mobility characteristics. For example, an inverter or a logic device, which includes the transistor, may be easily used as a peripheral device of an integrated stacked memory device that can be formed in a lower-temperature process, for example, a one diode-one resistor multi-layer cross point memory device. Further, the transistor according to example embodiments may supply a higher ON-current required to drive the integrated stacked memory device.

FIGS. 7A through 7J are perspective views for describing a method of manufacturing a stacked transistor according to example embodiments. The X, Y and Z directions are provided on FIGS. 7A though 7J for illustrative purposes only and should not be construed as limiting any example embodiment.

Figure 7A:
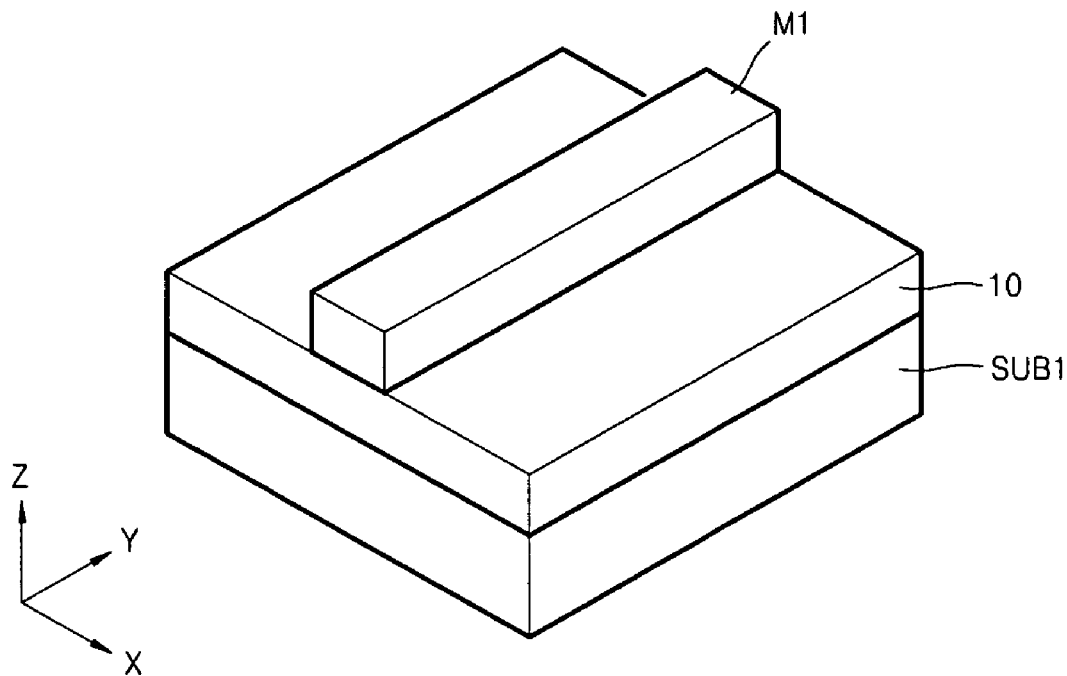
FIGS. 7A through 7J are perspective views for describing a method of manufacturing a stacked transistor according to example embodiments

Referring to FIG. 7A, an oxide semiconductor layer 10 may be formed on a substrate SUB1. The oxide semiconductor layer 10 may be, for example, a semiconductor layer containing a ZnO-based material. The oxide semiconductor layer 10 may further contain a group III element, a group IV element, or another element. The group III element may be, for example, In or In and Ga, and the group IV element may be, for example, Sn. Alternatively, the oxide semiconductor layer 10 may be a semiconductor layer containing an $In_2O_3$-based material. The oxide semiconductor layer 10 may further contain the group IV element such as Sn. According to example embodiments, the oxide semiconductor layer 10 may be more easily formed in a lower-temperature process. A first mask pattern M1 may be formed on the oxide semiconductor layer 10. The first mask pattern M1 may have, for example, a line shape extended in a Y direction.

Figure 7B:
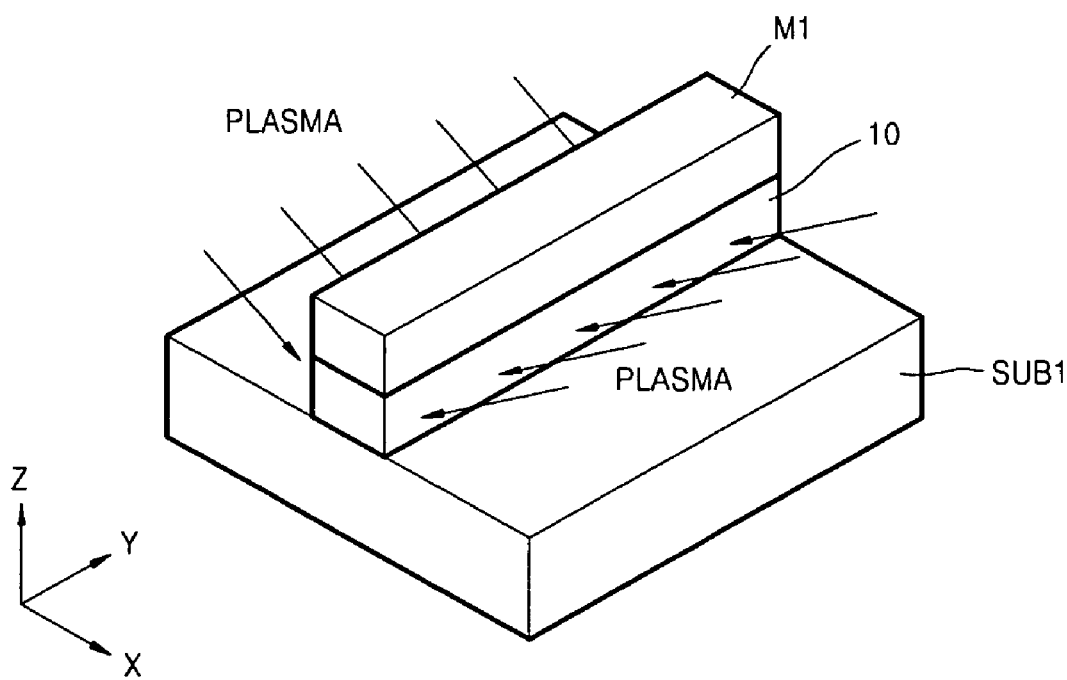

Referring to FIG. 7B, the oxide semiconductor layer 10 may be patterned by using the first mask pattern M1 as an etching barrier. Two side surfaces of the patterned oxide semiconductor layer 10 in an X direction may be treated with plasma. For example, the plasma may be Ar plasma. As the two side surfaces of the patterned oxide semiconductor layer 10 are treated with plasma, contact characteristics may be improved between the oxide semiconductor layer 10 and a source S1 and a drain D1 that may be formed as described below.

Figure 7C:
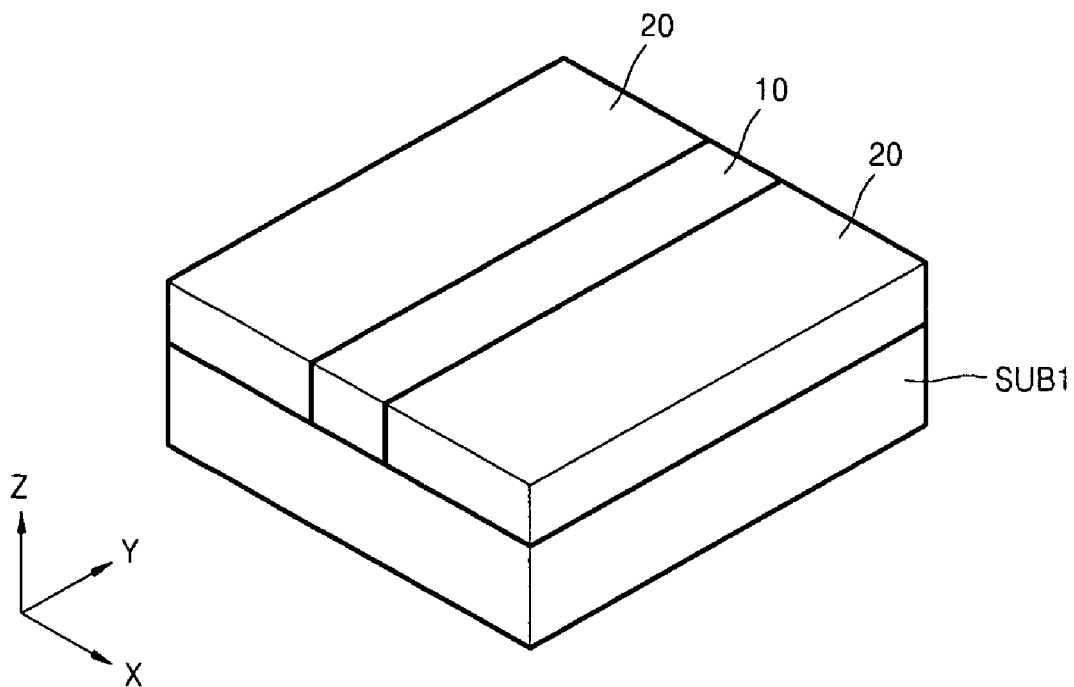

The first mask pattern M1 may be removed and source/drain material layers 20 may be formed on the two sides of the oxide semiconductor layer 10, as shown in FIG. 7C. The source/drain material layers 20 may be formed of a metal oxide or a metal. The metal oxide may be, for example, ITO, AZO, or IZO. The metal may be a higher work function material such as Ni, Pd, Pt, Ir, or Rh, a lower work function material such as Ta, Ti, or Er, or a material such as a material whose work function is between a higher work function of the higher work function material and a lower work function of the lower work function material, for example, Co, W, or Mo.

Figure 7D:
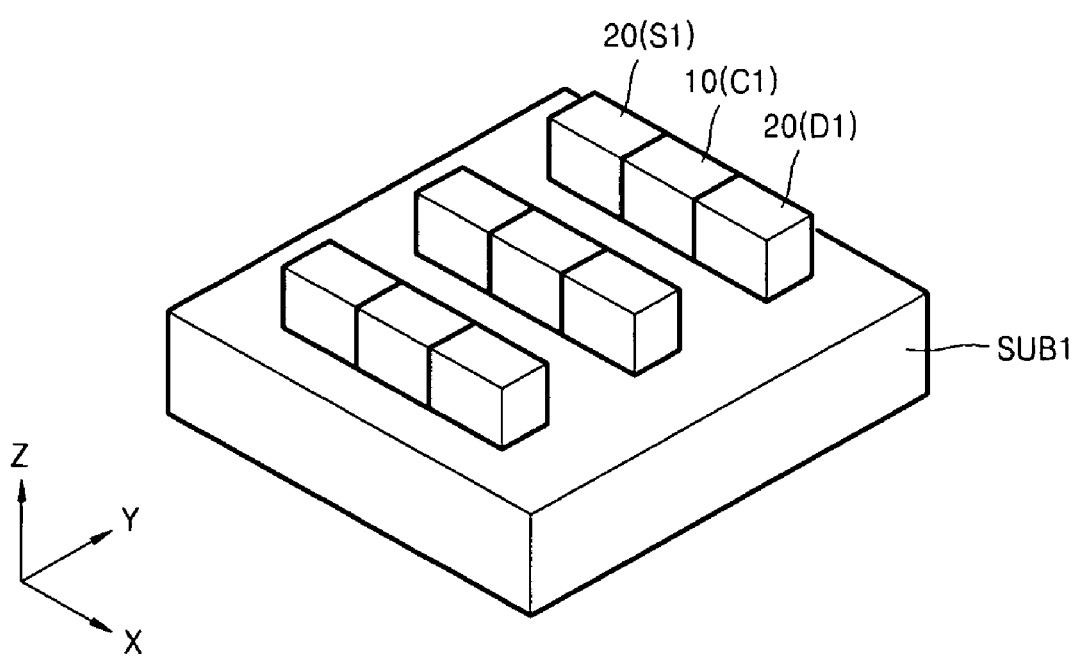

The oxide semiconductor layer 10 and the source/drain material layers 20 may be patterned and one or more pattern structures that are parallel to the X direction may be obtained as shown in FIG. 7D. Each of the pattern structures may have the oxide semiconductor layer 10 and the source/drain material layers 20 formed on the two sides of the oxide semiconductor layer 10. Hereinafter, the oxide semiconductor layer 10 is referred to as a first channel layer C1 and the source/drain material layers 20 on the two sides of the oxide semiconductor layer 10 are referred to as first sources S1 and first drains D1, respectively.

Figure 7E:
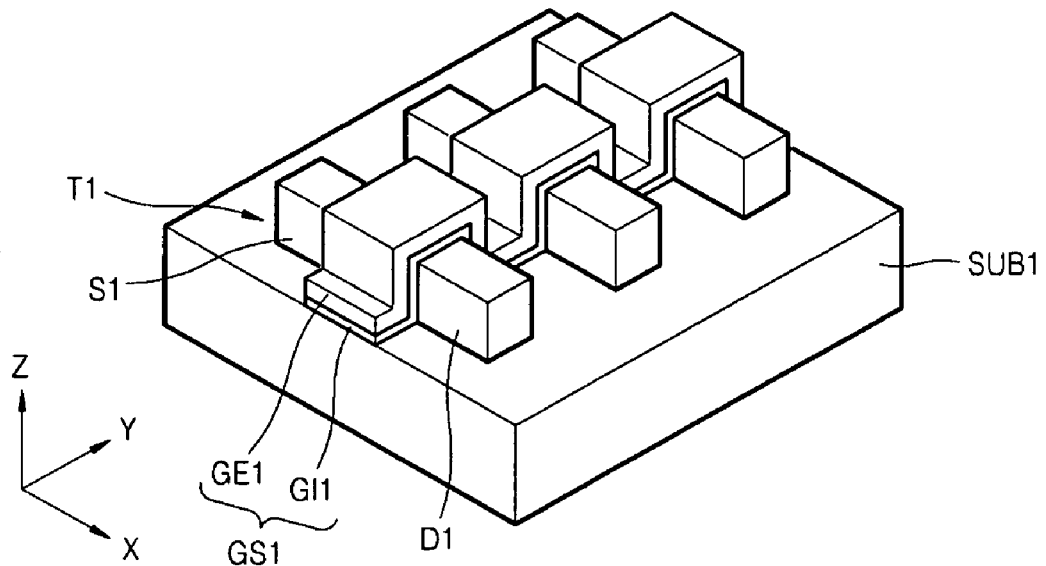

Referring to FIG. 7E, a first gate GS1 may be formed to cover top and side surfaces of first channel layers C1 in a width direction of the first channel layers C1, i.e., the Y direction. The first gate GS1 may be formed in a shape that extends in the Y direction as shown in FIG. 7E. Additional example embodiments provide that the first gate GS1 may be formed in a discontinuous shape, i.e., a separated shape. The first gate GS1 may include a first gate insulating layer GI1 and a first gate electrode GE1. The first gate insulating layer GI1 may contain a Si oxide, a Si nitride, or a variety of higher-K dielectric materials. The higher-K dielectric materials may include a Hf oxide, an Al oxide, a La oxide, a Zr oxide, a HfSi oxide, a HfSi nitric oxide, a HfLa oxide, a LaAl oxide, and a SiTi oxide. The first gate electrode GE1 may contain a higher work function material, for example, a metal such as Ni, Pd, Pt, Ir, or Rh, a metal nitride such as TiAlN, MoN, or TaCN, a metal oxide such as ITO or IZO, or a mixture thereof, may contain a lower work function material, for example, a metal such as Ta, Ti, or Er, a metal nitride such as $W_2N$, TaSiN, or (RE)TaN, a metal oxide such as $ITO_x$ or $IZO_x$, or a mixture thereof, or may include a material whose work function is between a higher work function of the higher work function material and a lower work function of the lower work function material, for example, a metal such as Co, W, or Mo and/or a nitride or an oxide having a controllable work function. As such, one or more first transistors T1 may be formed on the substrate SUB1.

Figure 7F:
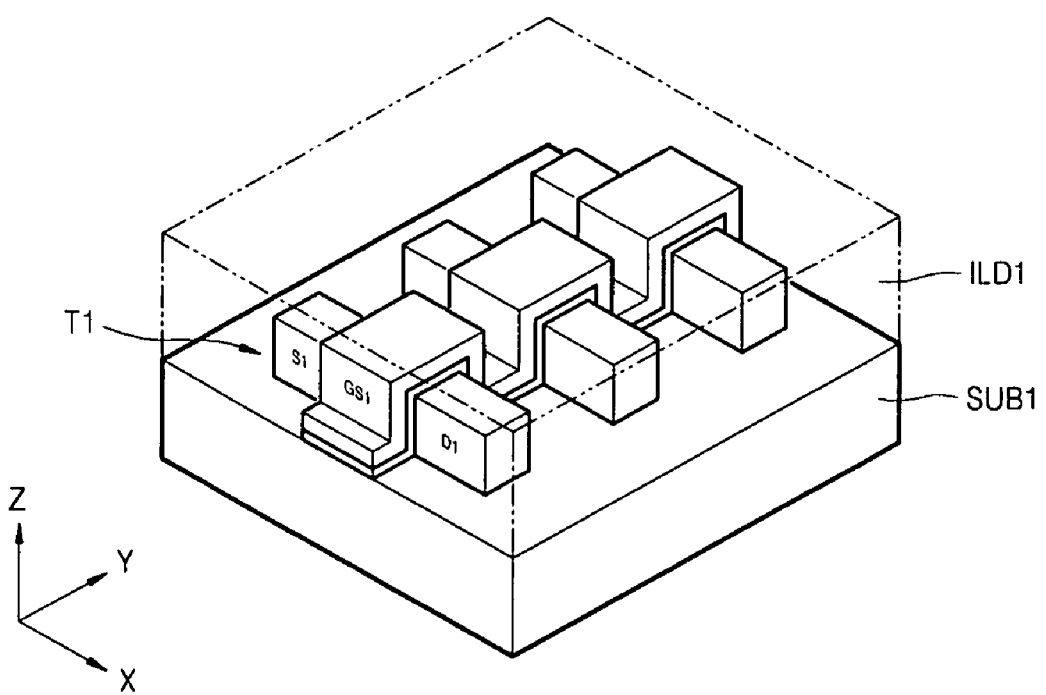

Referring to FIG. 7F, a first interlayer insulating layer ILD1 may be formed to cover the first transistors T1.

Figure 7G:
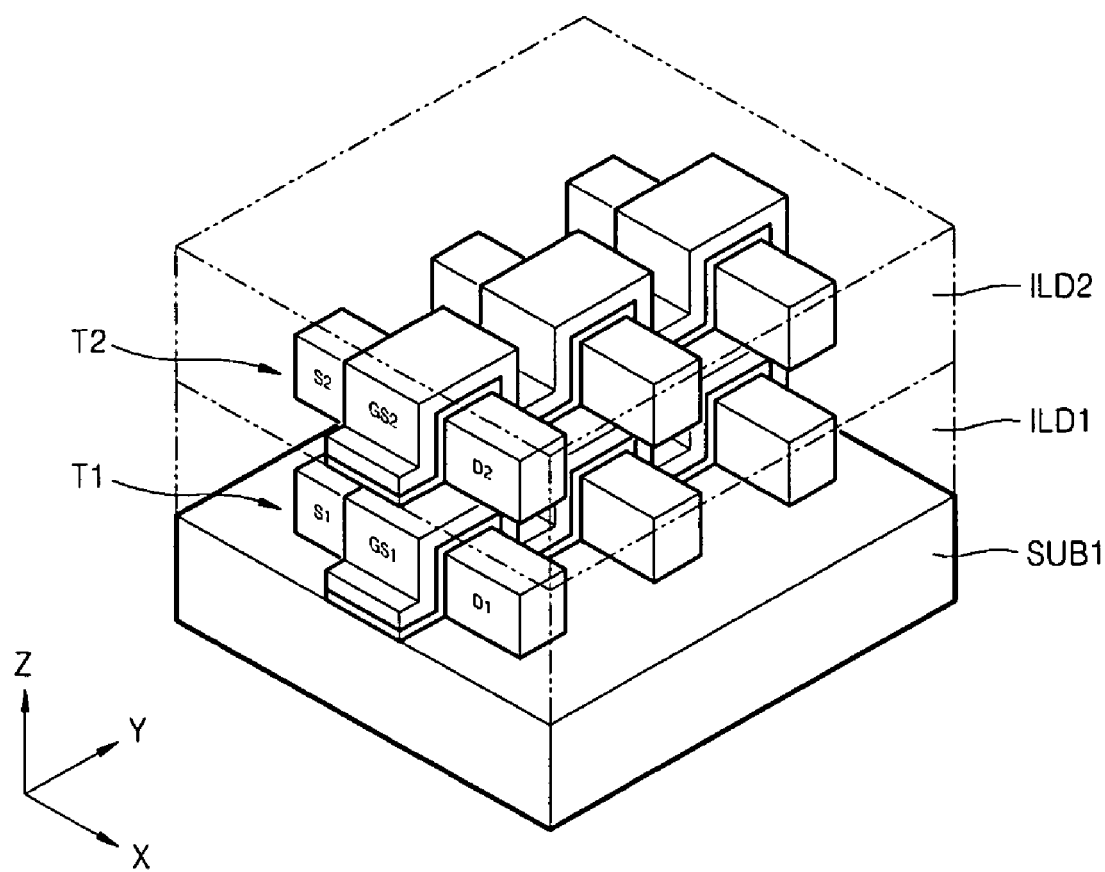

Referring to FIG. 7G, one or more second transistors T2 may be formed on the first interlayer insulating layer ILD1. The second transistors T2 may be formed by using the same method used to form the first transistors T1. A second interlayer insulating layer ILD2 may be formed to cover the second transistors T2.

Figure 7H:
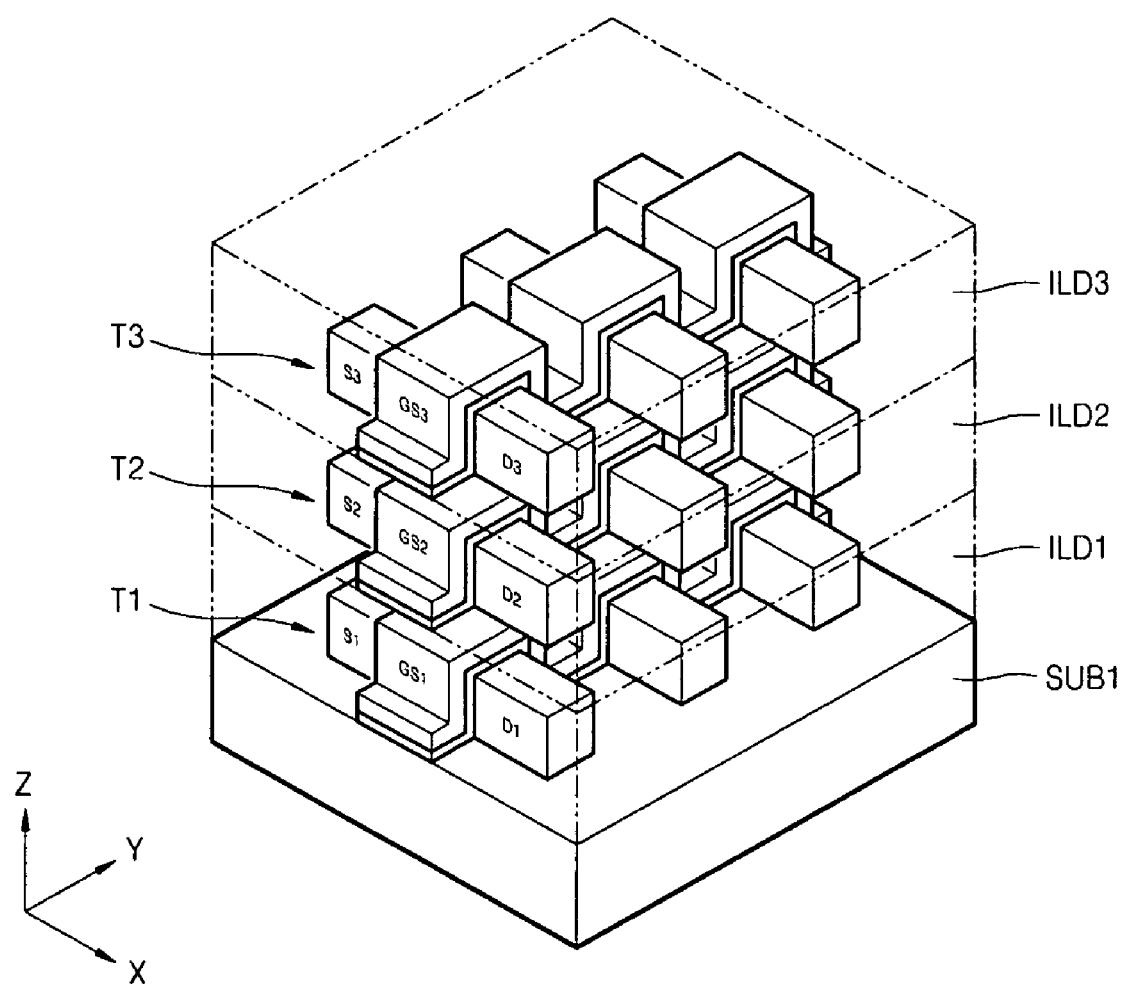

Referring to FIG. 7H, one or more third transistors T3 may be formed on the second interlayer insulating layer ILD2. The third transistors T3 may be formed by the same method used to form the first transistors T1. A third interlayer insulating layer ILD3 may be formed to cover the third transistors T3.

Figure 7I:
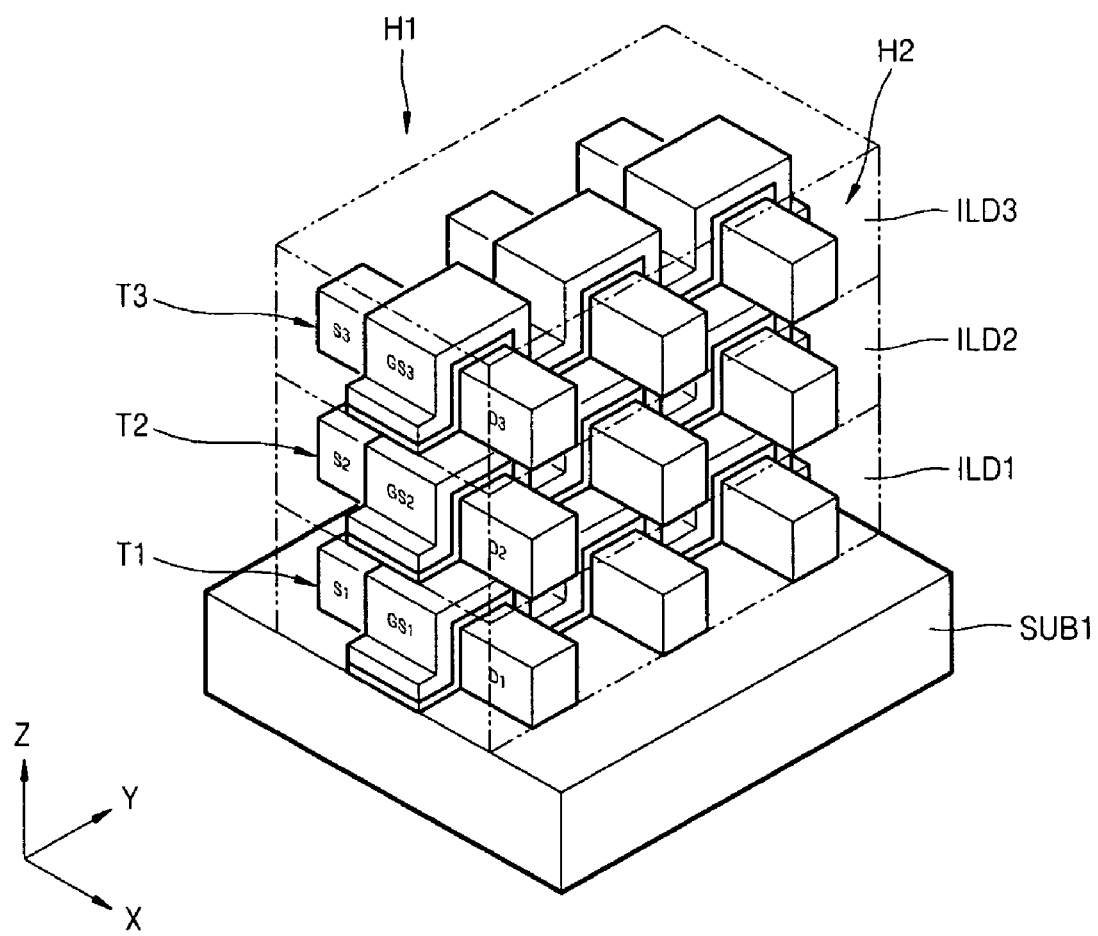

Referring to FIG. 7I, two side portions of the first through third interlayer insulating layers ILD1 through ILD3 in the X direction may be etched to form a first hole H1. The first hole H1 may expose ends of the first through third sources S1 through S3 of the first through third transistors T1 through T3. Additionally, two side portions of the first through third interlayer insulating layers ILD1 through ILD3 in the X direction may be etched to form a second hole H2. The second hold H2 may expose ends of first through third drains D1 through D3 of the first through third transistors T1 through T3. Although not shown in FIG. 7I, a third hole may also be formed to expose ends of first through third gates GS1 through GS3 of the first through third transistors T1 through T3.

Figure 7J:
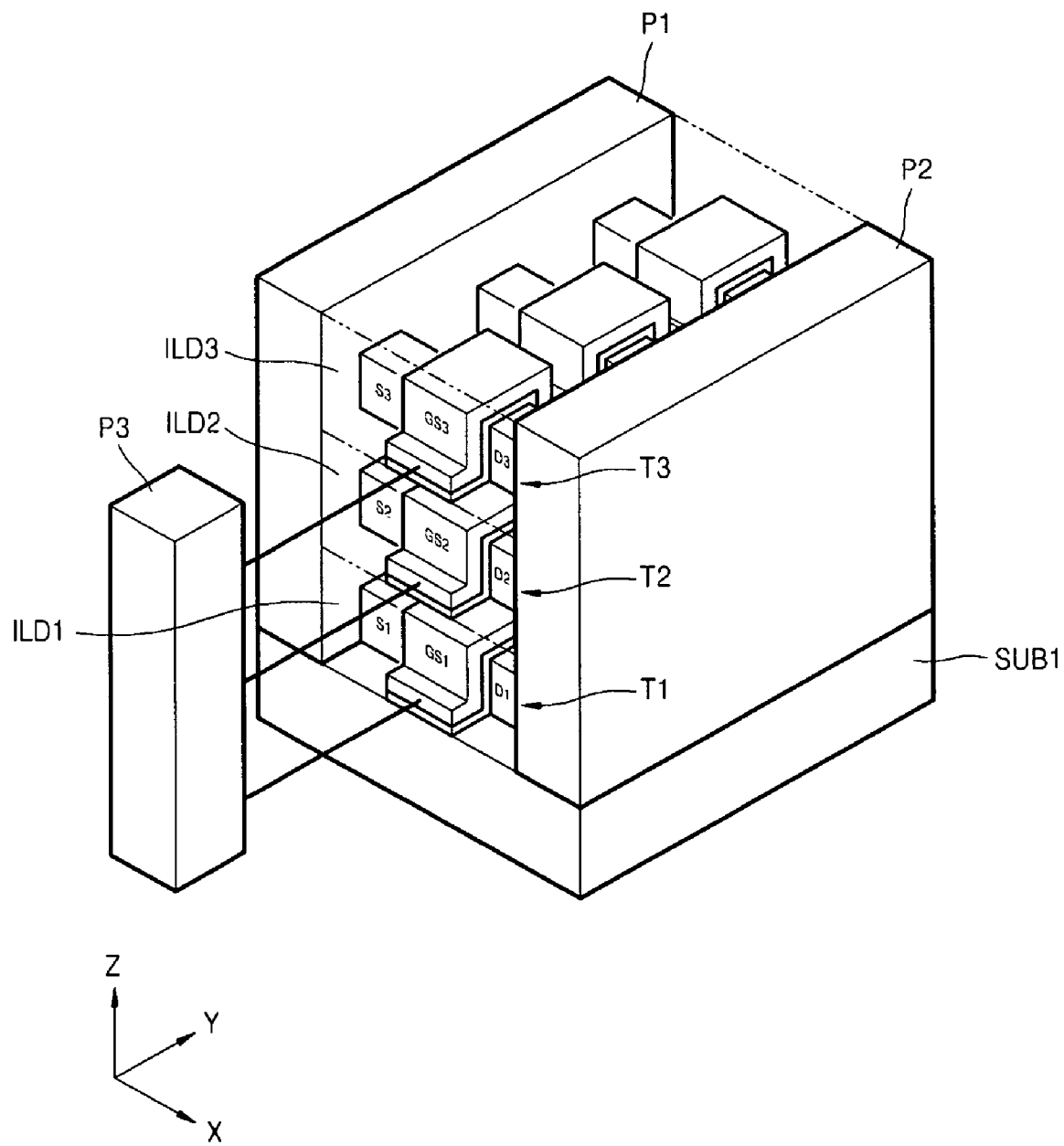

Referring to FIG. 7J, first and second conductive plugs P1 and P2 may be formed in the first and second holes H1 and H2, respectively. The first conductive plug P1 may contact the first through third sources S1 through S3 and the second conductive plug P2 may contact the first through third drains D1 through D3. A third conductive plug P3 may be formed in the third hole so as to contact the first through third gates GS1 through GS3.

Although not shown in FIG. 7J, first and second electrodes may be formed on the third interlayer insulating layer ILD3 so as to contact the first and second conductive plugs P1 and P2, respectively. A third electrode may also be formed on the third interlayer insulating layer ILD3 so as to contact the third conductive plug P3.

Example embodiments of the method illustrated in FIG. 7E through FIG. 7J may be modified to obtain the stacked transistor example embodiment illustrated in FIG. 6.

Oxide transistors may be stacked on one another in a three dimensional structure without an ion injection process and without a higher-temperature annealing process. Thus, a stacked transistor having a higher ON-current may be more easily implemented without characteristic deterioration caused by a higher-temperature process. Also, because various materials may be used to form a gate insulating layer and a gate electrode, characteristics of a transistor may be improved. A transistor according to example embodiments may be used to implement inverters and various logic devices such as a NAND device, a NOR device, an encoder, a decoder, a multiplexer (MUX), a demultiplexer (DEMUX), and a sense amplifier.

FIGS. 8A through 8D are perspective views for describing a method of manufacturing a stacked transistor according to example embodiments. The X, Y and Z directions are provided on FIGS. 8A through 8D for illustrative purposes only and should not be construed as limiting any example embodiment.

Figure 8A:
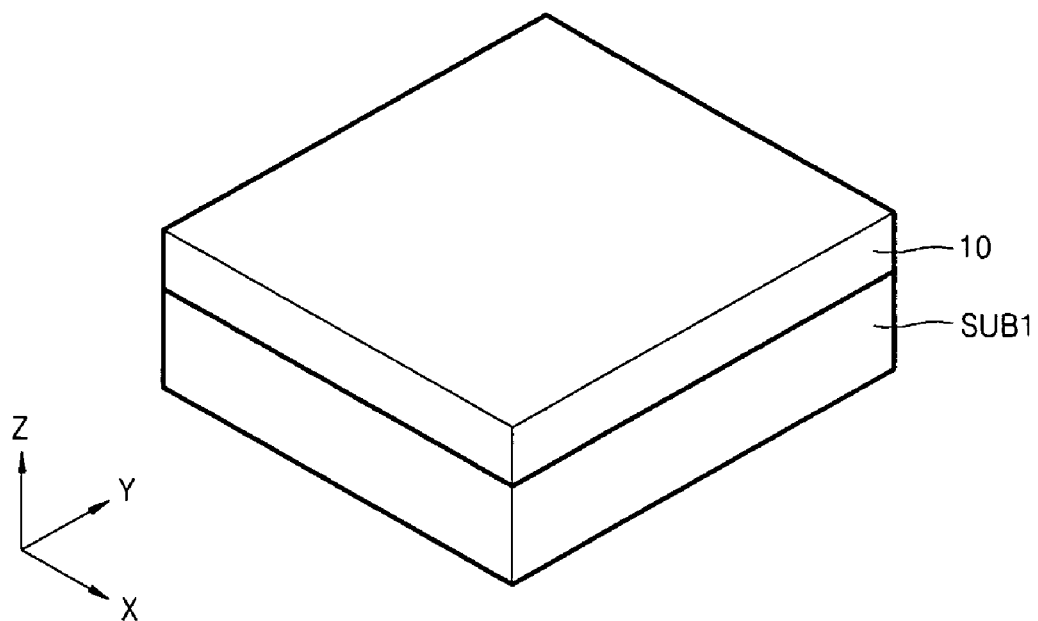
FIGS. 8A through 8D are perspective views for describing a method of manufacturing a stacked transistor according to example embodiments.

Referring to FIG. 8A, an oxide semiconductor layer 10 may be formed on a substrate SUB1. The oxide semiconductor layer 10 may be the same as the oxide semiconductor layer 10 according to example embodiments illustrated in FIG. 7A.

Figure 8B:
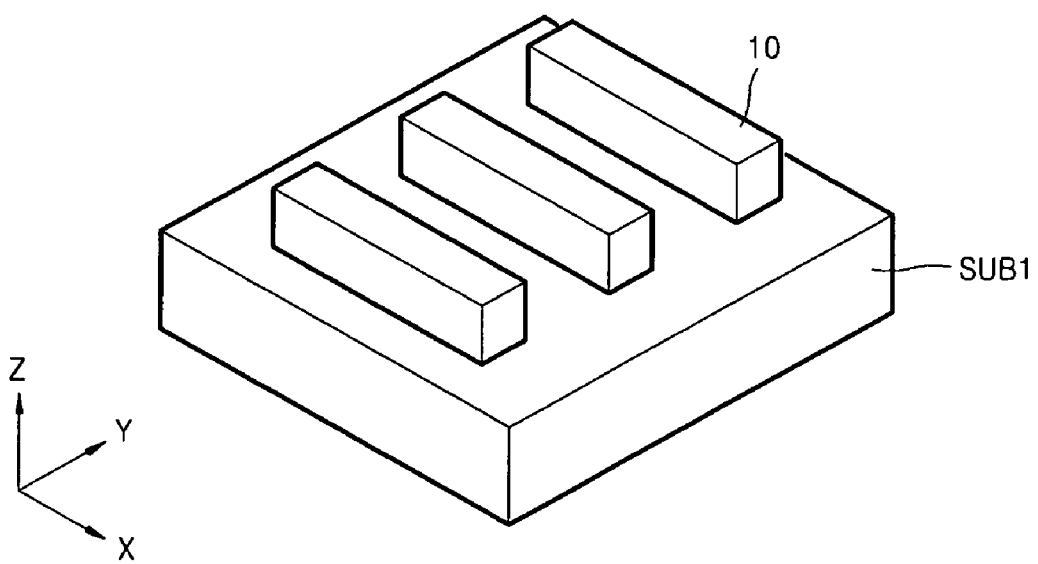

The oxide semiconductor layer 10 may be patterned to obtain one or more oxide semiconductor layers 10 that extend in an X direction, as shown in FIG. 8B. Hereinafter, the obtained oxide semiconductor layers 10 are referred to as oxide semiconductor layer patterns 10.

Figure 8C:
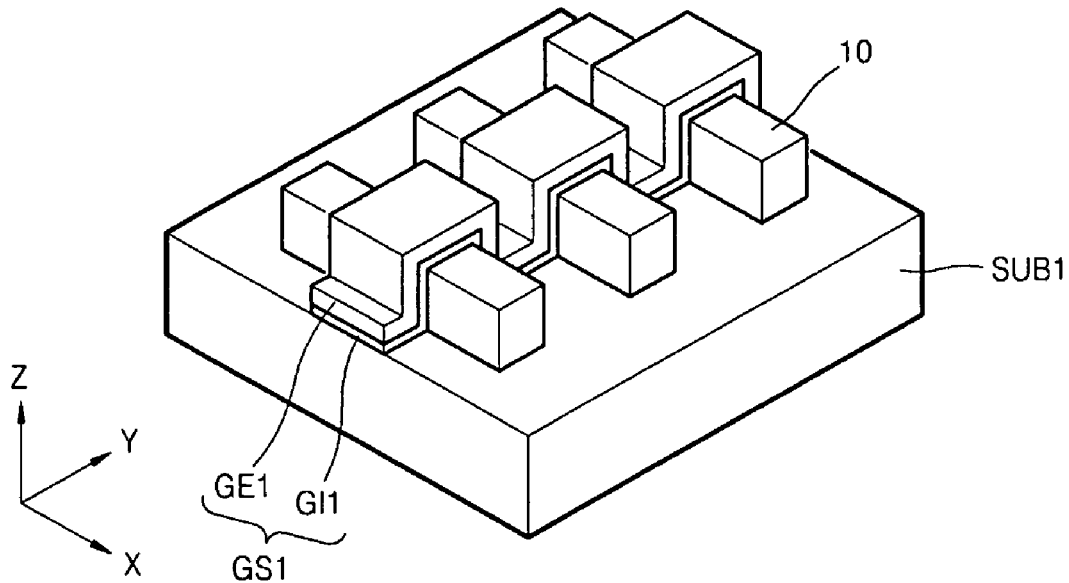

Referring to FIG. 8C, a first gate GS1 may be formed on the substrate SUB1 so as to cover center portions of the oxide semiconductor layer patterns 10. The first gate GS1 may be the same as the first gate GS1 illustrated in FIG. 7E. The first gate GS1 may be formed in a shape that extends in a Y direction as shown in FIG. 8C. Additional example embodiments provide that the first gate GS1 may be formed in a discontinuous shape, i.e., a separated shape.

Figure 8D:
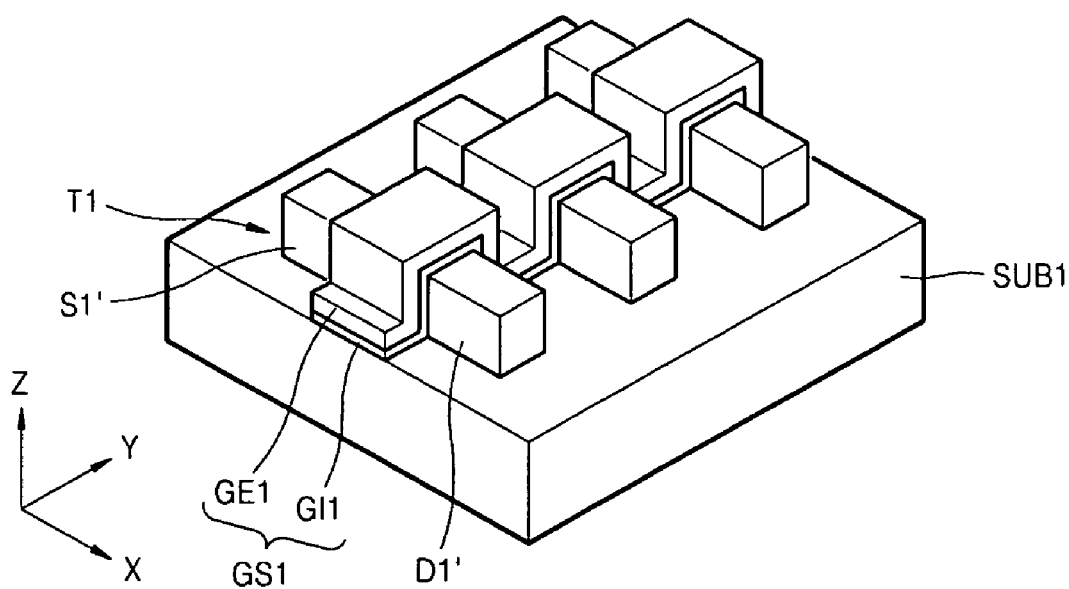

Two side portions of the oxide semiconductor layer patterns 10, which are not covered by the first gate GS1, may be treated with plasma so as to form first sources S1' and first drains D1', as shown in FIG. 8D. Here, the plasma may be single gas plasma (e.g., Ar plasma, Xe plasma, H plasma, H-containing gas plasma, etc.) or mixed gas plasma (e.g., $SF_6/O_2$ mixed gas plasma, etc.). First channel layers may be defined between the first sources S1' and the first drains D1'. After the two side portions of the oxide semiconductor layer patterns 10 not covered by the first gate GS1 are initially treated with the plasma, insulating spacers may be formed on two side surfaces of the first gate GS1 and the two side portions of the oxide semiconductor layer patterns 10, which are covered neither by the first gate GS1 nor by the insulating spacers, may be re-treated with the plasma. Portions of the oxide semiconductor layer patterns 10, which are covered by the insulating spacers, may be processed in the plasma once, and portions of the oxide semiconductor layer patterns 10 which are covered neither by the first gate GS1 nor by the insulating spacers may be processed in the plasma twice. Portions processed in the plasma twice may have a higher electrical conductivity than the portions that are processed in the plasma once. Thus, example embodiments of the first sources S1' and the first drains D1' may have a similar structure to a lightly doped drain.

Although not shown in FIG. 8D, a first interlayer insulating layer may be formed to cover first transistors T1' and one or more second transistors. A second interlayer insulating layer may be formed on the first interlayer insulating layer. One or more third transistors and a third interlayer insulating layer may be formed on the second interlayer insulating layer. The second and third transistors may be formed by using a similar method to the example embodiments of the method used to form the first transistors T1'. Also, conductive plugs may be formed by using a similar method to the example embodiments of the method illustrated in FIGS. 7I and 7J, thereby forming a similar structure to the example embodiments illustrated in FIG. 5 or FIG. 6.

The above descriptions should be construed as example embodiments, which may vary and are not limiting. For example, one of ordinary skill in the art would understand that elements and structures of the transistor example embodiments illustrated in FIGS. 1 through 6 may be varied and modified. For example, in FIG. 4, the first transistors T1 in the first area L1 may be used as a single transistor, and the second transistors T2 in the second area L2 may be used as another single transistor. Also, the third transistors T3 may not be formed. Further, one or more additional transistors may be further stacked on the third transistors T3. Example embodiments also provide that each of a plurality of stacked transistors may be separately used. Furthermore, the example embodiments illustrated in FIGS. 7A through 7J and 8A through 8D may also be modified in various forms.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A transistor comprising:
a channel layer formed of an oxide semiconductor;
a source and a drain configured to separately contact two end faces of the channel layer in a length direction of the channel layer; and
a gate configured to cover top and side surfaces of the channel layer in a width direction of the channel layer,
wherein the channel layer, the source and the drain have a same width in the width direction of the channel layer, and
wherein the channel layer, the source and the drain constitute a rectangular solid structure.

2. A transistor comprising:
a channel layer formed of an oxide semiconductor;
a source and a drain configured to separately contact two end faces of the channel layer in a length direction of the channel layer; and
a gate configured to cover top and side surfaces of the channel layer in a width direction of the channel layer,
wherein the source and the drain are formed of one of metal and metal oxide, and
wherein the two end faces of the channel layer are plasma treated surfaces contacting the source and the drain so that a Schottky barrier is formed between the source and the channel layer and between the drain and the channel layer.

3. A stacked transistor comprising:
one or more first transistors on a substrate, wherein each of the one or more first transistors includes
a channel layer formed of an oxide semiconductor,
a source and a drain configured to separately contact two end faces of the channel layer in a length direction of the channel layer, and
a gate configured to cover top and side surfaces of the channel layer in a width direction of the channel layer; and
one or more second transistors vertically stacked on the one or more first transistors,
wherein the one or more first transistors are separated from the one or more second transistors by an insulating layer interposed therebetween, and
wherein at least one gate of the one or more first transistors is separated from at least one gate of the one or more second transistors.

4. The stacked transistor of claim 3, wherein the oxide semiconductor comprises a zinc oxide (ZnO)-based material or an indium oxide ($In_2O_3$)-based material.

5. The stacked transistor of claim 3, wherein the source and the drain comprise a metal oxide or a metal.

6. The stacked transistor of claim 3, wherein the two end faces of the channel layer are plasma treated surfaces that contact the source and the drain.

7. The stacked transistor of claim 3, wherein the source and the drain are oxide semiconductor layers having plasma treated surfaces that contact the two end faces of the channel layer.

8. The stacked transistor of claim 3, wherein the one or more second transistors have the same structure as the one or more first transistors.

9. The stacked transistor of claim 3, further comprising:
a first common electrode which is commonly connected to sources of the one or more first transistors and the one or more second transistors;
a second common electrode which is commonly connected to drains of the one or more first transistors and the one or more second transistors; and
a third common electrode which is commonly connected to the gates of the one or more first transistors and the one or more second transistors.

10. The stacked transistor of claim 3, wherein the two end faces are perpendicular to the length direction of the channel layer.

11. The stacked transistor of claim 3, wherein a distance between the two end faces corresponds to a total length of the channel layer.

12. The stacked transistor of claim 3, wherein the gate is configured so as to not cover a bottom surface of the channel layer.

13. The stacked transistor of claim 3, wherein at least one of the source, the drain, and the channel layer has a plasma treated surface.

14. The stacked transistor of claim 3, wherein a cross-section of the channel layer has a tetragonal shape, and the gate is configured so as to not cover a bottom surface of the channel layer.

15. The stacked transistor of claim 3, wherein the channel layer, the source and the drain have a same width in the width direction of the channel layer.

16. The stacked transistor of claim 3, wherein the channel layer, the source and the drain constitute a rectangular solid structure.

17. The stacked transistor of claim 3, wherein the channel layer, the source and the drain have a same height.

18. A transistor comprising:
one or more first transistors on a substrate, wherein each of the one or more first transistors includes
a channel layer formed of an oxide semiconductor,
a source and a drain configured to separately contact two end faces of the channel layer in a length direction of the channel layer, and
a gate configured to cover top and side surfaces of the channel layer in a width direction of the channel layer; and
one or more second transistors which are vertically stacked on the one or more first transistors,
wherein the one or more first transistors and the one or more second transistors are divided into first group transistors and second group transistors,
wherein sources, drains, and gates of the first group transistors are commonly connected to first, second, and third common electrodes, respectively, and
wherein sources, drains, and gates of the second group transistors are commonly connected to fourth, fifth, and sixth electrodes, respectively.

* * * * *